United States Patent [19]
Zierhofer

[11] Patent Number: 5,983,139
[45] Date of Patent: Nov. 9, 1999

[54] COCHLEAR IMPLANT SYSTEM

[75] Inventor: Clemens Zierhofer, Kundl, Austria

[73] Assignee: MED-EL Elektromedizinische Gerate Ges.m.b.H., Innsbruck, Austria

[21] Appl. No.: 09/067,673

[22] Filed: Apr. 28, 1998

Related U.S. Application Data

[60] Provisional application No. 60/045,279, May 1, 1997.

[51] Int. Cl.$^6$ .............................. A61N 1/36; H04R 25/00
[52] U.S. Cl. ................................................................ 607/56
[58] Field of Search ................................................ 607/56

[56] References Cited

U.S. PATENT DOCUMENTS

| | | | |
|---|---|---|---|
| 5,012,245 | 4/1991 | Scott et al. | 341/118 |
| 5,027,306 | 6/1991 | Dattorro et al. | 364/724 |
| 5,323,157 | 6/1994 | Ledzius et al. | 341/143 |
| 5,357,252 | 10/1994 | Ledzius et al. | 341/143 |
| 5,408,235 | 4/1995 | Doyle et al. | 341/143 |
| 5,549,658 | 8/1996 | Shannon et al. | 607/57 |
| 5,601,617 | 2/1997 | Loeb et al. | 607/56 |
| 5,626,629 | 5/1997 | Faltys et al. | 607/57 |

*Primary Examiner*—William E. Kamm
*Assistant Examiner*—Carl H. Layno
*Attorney, Agent, or Firm*—Bromberg & Sunstein LLP

[57] ABSTRACT

A digital finite impulse response bandpass filter is described. Analog to digital conversion (A/D) of an input signal uses a Sigma-Delta ($\Sigma$-$\Delta$) converter, resulting in a digital sequence representation of the input signal. A low-pass FIR filter convolves the binary sequence to produce a low-pass vector, and a digital comb filter defined by at least one set of weighted and time-shifted unit impulses convolves the low-pass vector with the comb filter weights. An envelope detector detects a bandpass envelope of the digital FIR bandpass filter. Also described is a filter bank of a plurality of such digital FIR filters arranged in parallel.

A square root of a sum of squares of the convolution products of the low-pass vector with the comb filter weights is calculated to estimate the bandpass envelope. The square root of the sum of two squares is estimated by determining the greater of the roots of the two squares and the lesser of the roots of the two squares, calculating a sum of one half the lesser of the roots of the two squares and one half a product of the greater of the roots of the two squares and the square root of three, and selecting whichever is larger between the greater of the roots of the two squares and the sum of one half the lesser of the roots of the two squares and one half the product of the greater of the roots of the two squares and the square root of three.

29 Claims, 4 Drawing Sheets

FIG. 4 ość# COCHLEAR IMPLANT SYSTEM

This application claims priority from provisional application number 60/045,279, filed May 1, 1997, which is hereby incorporated herein by reference.

TECHNICAL FIELD

The present invention pertains to low power digital signal processing particularly as employed in cochlear implants.

BACKGROUND OF THE INVENTION

In the field of cochlear implants, electrostimulation of the acoustic nerve by the technique of continuous interleaved sampling (CIS) has successfully achieved high levels of speech recognition. The signal processing used in CIS, as implemented in an external speech processor, commonly employs a filter bank for splitting up the audio frequency range. The amplitudes of the stimulation pulses within the cochlea are derived from the envelopes of the band pass filter output signals.

At present, commercially available Digital Signal Processors (DSP) are used to perform speech processing according to CIS. For example, the digital signal processing for a 12-channel CIS typically comprises the following stages:

(1) a digital filter bank having 12 digital Butterworth band pass filters of 6th order, Infinite Impulse Response (IIR) type;

(2) 12 subsequent rectifiers and 12 digital Butterworth low pass filters of 2nd order, IIR-type, for envelope detection; and (3) a stage for patient specific estimation of the stimulation amplitudes from the envelope signals.

The DSP power consumption in a speech processor typically is about 300 mW. Thus, comparatively large batteries (usually AA-sized) are necessary, resulting in speech processor dimensions of about 90×70×20 mm$^3$.

SUMMARY OF THE INVENTION

In accordance with a preferred embodiment of the present invention, there is provided an apparatus for processing an audio input signal with a digital finite-impulse-response (FIR) bandpass filter. In this embodiment, the FIR bandpass filter has an oversampling type analog to digital converter to convert the input audio signal into a digital sequence, a low-pass FIR filter to convolve the binary sequence to produce a low-pass vector, a digital comb filter defined by at least one set of weighted and time-shifted unit impulses to convolve the low-pass vector with the comb filter weights, and an envelope detector to detect a bandpass envelope of the digital FIR bandpass filter.

In further embodiments, the analog to digital converter may use sigma-delta modulation to produce a two-level binary sequence. The low-pass FIR filter may directly convolve the digital sequence by multiplying and accumulating the digital sequence with a low-pass FIR filter impulse response. The low-pass FIR filter may be further comprised of an input filter to convolve the binary sequence to produce a five level sequence, and a peripheral filter to convolve the five level sequence to produce the low-pass vector. The low-pass filter may further include an output counter to downsample the low-pass vector which may further be sequentially stored in a low-pass random access memory (RAM).

Also in further embodiments, the digital comb filter may further include comb filter weight RAM to store the sets of comb filter weights and an Arithmetic Logic Unit (ALU) to calculate a convolution product of the downsampled low-pass vector with the comb filter weights. The comb filter weight RAM may store two orthogonal sets of comb filter weights, in which case, the ALU further calculates convolution products of the downsampled low-pass vector with the two orthogonal sets of comb filter weights. The ALU may comprise the envelope detector, in which case it estimates an envelope of the digital FIR bandpass filter by calculating a square root of a sum of squares of the convolution products of the downsampled low-pass vector with the two orthogonal sets of comb filter weights. The ALU estimates the value of the square root of the sum of two squares by determining the greater of the roots of the two squares and the lesser of the roots of the two squares, calculating a sum of one half the lesser of the roots of the two squares and one half a product of the greater of the roots of the two squares and the square root of three, and selecting whichever is larger between the greater of the roots of the two squares and the sum of one half the lesser of the roots of the two squares and one half the product of the greater of the roots of the two squares and the square root of three.

In accordance with another embodiment of the present invention, a plurality of such digital FIR bandpass filters may be arranged in parallel to form a digital filter bank. In yet a further embodiment, such a digital FIR bandpass filter or a filter bank of such digital FIR bandpass filters may be a subpart of an external portion of a cochlear implant system for providing auditory signals to an implantable portion for implantation into a person.

BRIEF DESCRIPTION OF THE DRAWINGS

The foregoing and other objects and advantages of the invention will be appreciated more fully from the following further description thereof with reference to the accompanying drawings wherein.

DETAILED DESCRIPTION OF PREFERRED EMBODIMENTS

A preferred embodiment of the present invention implements a digital signal processing scheme for CIS implementation suitable for integration in an Application Specific Integrated Circuit (ASIC). This significantly reduces the power consumption of the CIS speech processing as compared to prior techniques, which enables miniaturization of the speech processor to a Behind-The-Ear (BTE) device.

A preferred embodiment of the present invention includes an implementation of a digital filter bank with estimation of the envelopes of the band pass filter bank. For example, a preferred embodiment employs a 12 channel filter bank wherein each channel is designed to pass only a relatively narrow selected band of frequencies around some center frequency. By proper selection of filter channel frequencies, the entire filter bank may process all or a large part of the audio frequency spectrum.

In a preferred embodiment, an input audio signal initially undergoes analog-to-digital conversion by use of Sigma Delta (Σ-Δ) Modulation at a relatively high sampling rate, $f_0$, resulting in a two-level sequence x(n) at the rate $f_0$. Each filter channel of the digital filter bank in a preferred embodiment then employs fixed impulse response (FIR) bandpass filters. The center frequency $f_r$ of each FIR band-pass filter is related to the approximate Σ-Δ rate $f_0$ and an integer parameter s by:

$$f_r \approx \frac{f_0}{16s}.$$

Each FIR band-pass filter also has a filter characteristic defined by a set of comb filter weights $w_i$, with typically i=0,1, . . . 7. In general, bell-shaped pass band characteristics are obtained, with side lobes typically attenuated by 24 dB.

For each filter channel of a preferred embodiment, envelope detection is achieved by implementing two FIR bandpass filters with approximately orthogonal impulse responses h(n) and h̲(n). The impulse responses h(n) and h̲(n) have equal (or almost equal) filter amplitude characteristics. Thus, the convolution products y(n)=h(n)*x(n) and y̲(n)=h̲(n)*x(n) are related to each other via the Hilbert Transform. Final estimation of the bandpass envelopes of each filter channel employs the equation:

$$e(n) = \sqrt{y^2(n) + \underline{y}^2(n)}$$

as performed within an Arithmetic Logic Unit (ALU) by use of an approximation method. The calculation error is between 0 and −3.4%.

A more detailed description of a preferred embodiment of the present invention starts with analog-to-digital conversion of an analog input signal, accomplished by means of a Sigma-Delta (Σ-Δ) modulator. Sigma Delta modulation is a well-known method of analog-to-digital conversion by the oversampling technique, described in greater detail in J. C. Candy and G. C. Temes, "Oversampling Delta-Sigma Converters," Oversampling Methods for A/D and D/A Conversion, eds. J. C. Candy and G. C. Temes, IEEE Press, 1991, incorporated herein by reference. The output of the Σ-Δ modulator is a binary sequence x(n) ∈ [−1,+1] at a rate equal to the sampling rate $f_0$. The spectrum X(f) of x(n) is composed of the spectrum of the audio input signal plus the shaped spectrum of the quantization noise.

For each filter channel of a preferred embodiment, the convolutions of the input Σ-Δ input sequence x(n) with orthogonal FIR filter impulse responses h(n) and h̲(n), respectively, are performed in two stages: peripheral convolution and central convolution. The peripheral convolution involves low pass filtering and downsampling in a peripheral filter stage. Downsampling, or decimation, is the reduction in sampling rate by an integral factor. The low pass filter is operated at the comparatively high Σ-Δ rate $f_0$, but the impulse response of the low pass filter is extremely simple. Thus, the implementation requires only few binary counters with variable increments. The peripheral convolution results are stored in a peripheral RAM (Random Access Memory) at a rate (¼s)$f_0$, which corresponds to a decimation by a factor of 4s. Each peripheral convolution stage is implemented such that it operates completely independently of the following processing stages.

The central convolution stage of a preferred embodiment involves convolution of the peripheral convolution results with two sets of comb filter weights. This is performed by means of an Arithmetic Logic Unit (ALU), which is driven by a micro program. Similar to a DSP, comparatively complicated operations, e.g. Multiply-and-Accumulate (MAC) operations, are performed. However, since the bandwidth of the envelope signals is comparatively low, the clock frequency of the ALU can be kept very low, resulting in strongly reduced ALU power consumption.

The computational efficiency of the direct convolution technique of preferred embodiments is actually the result of choosing a low order filter design with a generally bell-shaped frequency response rather than a higher order filter with a more well-defined frequency response. Although a sixth order infinite impulse response Butterworth filter typically used in the prior art may have more sharply defined frequency responses, such a design requires significantly more system computations which in aggregate require relatively substantial power resources. Moreover, some preliminary informal data suggest that users are not sensitive to the difference in frequency response. In fact, users actually seem to prefer the bell-shaped bandpass frequency response of preferred embodiments of the present invention over the more sharply defined frequency responses characteristic of the prior art.

Each digital bandpass filter channel of a preferred embodiment is implemented by directly using the two-level high-frequency sequence x(n). The impulse response h(n) is of finite length (FIR-type) and can be written as the convolution product of the impulse responses of a low pass filter $h_{lp}(n)$ and a comb filter $\psi_s(n)$:

$$h(n)=h_{lp}(n)*\psi_s(n). \tag{Eq. 1}$$

The low pass filter $h_{lp}(n)$ represents the peripheral convolution stage and the comb filter $\psi_s(n)$ represents the central convolution stage described above. The low pass filter impulse response $h_{lp}(n)$ is further the convolution product of two filter impulse responses $h_0(n)$ and $h_s(n)$, i.e., $$h_{lp}(n)=h_0(n)*h_s(n). \tag{Eq. 2}$$

Response $h_0(n)$ is given by:

$$h_0(n) = \left[\frac{1}{2} 1 \frac{1}{2}\right]. \tag{Eq. 3}$$

For convenience, here and in the following, a finite impulse response is defined by a vector. Coefficients within the brackets denote the values of the impulse response at n=0, 1, etc. Coefficients outside the range covered by the brackets are zero. MATLAB notation for vectors is used.

Filter Impulse response $h_s(n)$ is composed of two vectors $h_{s,up}$ and $h_{s,down}$, $$h_s(n)=[h_{s,up} h_{s,down}], \tag{Eq. 4}$$

and shows even symmetry, i.e., $$h_{s,down}=h_{s,up}(\text{length}(h_{s,up}):-1:1). \tag{Eq. 5}$$

Vector $h_{s,up}$ has of four segments of equal lengths s, respectively, $$h_{s,up}=[h_{s,a} h_{s,b} h_{s,c} h_{s,d}] \tag{Eq. 6}$$

where $$h_{s,a}=[10101\ldots] \tag{Eq. 7a}$$

$$h_{s,b}=[11111\ldots] \tag{Eq. 7b}$$

$h_{s,c}=[21212\ldots]$ (Eq. 7c)

$h_{s,d}=[22222\ldots]$ (Eq. 7d)

Convolution of $h_s(n)$ with $h_0(n)$ removes the oscillating character of segments $h_{s,a}$ and $h_{s,c}$ resulting in a stair-like response $h_{lp}(n)$.

For example, $h_s(n)$ for s=4 is given by $h_s(n)=[10101111212122222222121211110101]$. (Eq. 8)

Convolution with $h_0(n)$ yields $$h_{lp}(n) = \left[\frac{1}{2}1111\frac{3}{2}22\frac{5}{2}3333\frac{7}{2}444444\frac{7}{2}3333\frac{5}{2}22\frac{3}{2}1111\frac{1}{2}\right].$$ (Eq. 9)

Filter response $\psi_s(n)$ represents a comb filter composed of a set of weighted and equidistant unit impulses, $$\psi_S(n) = \sum_{i=0}^{7} w_i \delta(n - i8s)$$ (Eq. 10)

The distance between the unit impulses is 8s. Weights $w_i(i=0, 1, \ldots 7)$ are usually derived by sampling a window function (e.g., Hamming window) and then multiplying every second sample with −1, resulting in a sequence with alternating sign. Convolution of $\Psi_s(n)$ with impulse response $h_{lp}(n)$ causes a superposition of eight amplified and time-shifted responses $h_{lp}(n)$.

Figure 1:
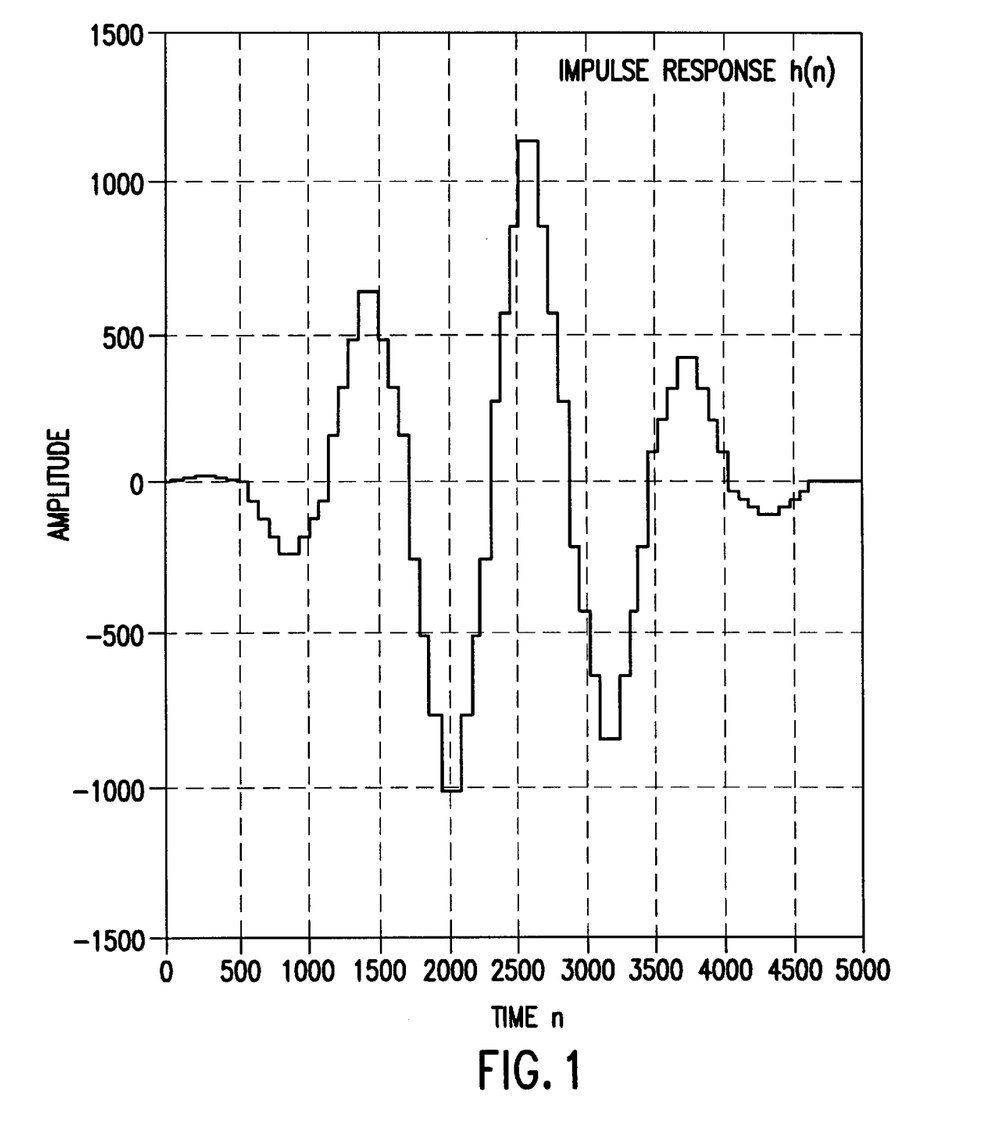
FIG. 1 depicts the impulse response h(n) for s=72 and $w_i$={3–30 80–128 142–107 53–13}.

An embodiment of an FIR impulse response h(n) for s=72, $w_i=\{3-30\ 80-128\ 142-107\ 53-13\}$ is shown in FIG. 1. Response h(n) represents a band pass filter with a resonance frequency which is approximately defined by the distance between the zero crossings. It aims at approximating an impulse response composed of four periods of a window-weighted sinusoid. In the frequency domain, the convolution product of Eq. 1 is replaced by the product of the corresponding Fourier transforms of low pass filter $H_{lp}(f)$ and comb filter $\Psi_s(f)$, i.e., $H(f)=H_{lp}(f)\Psi_s(f)$. (Eq. 11)

Figure 2A:
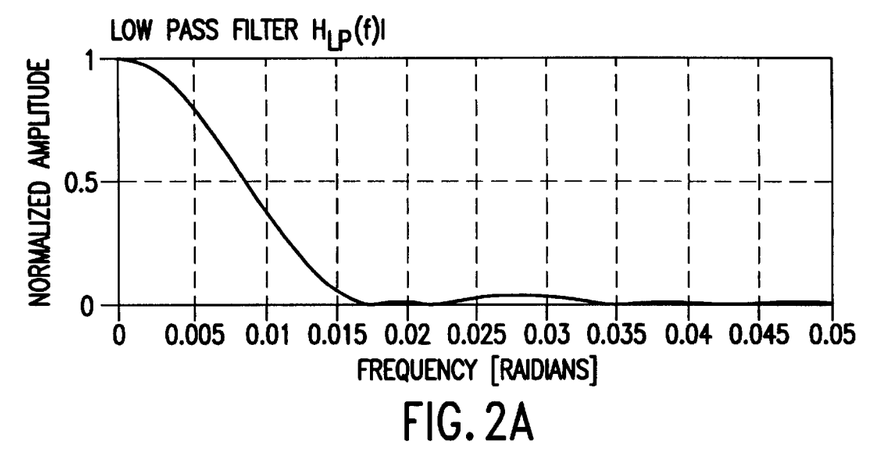
FIG. 2 depicts the amplitude characteristics of low pass filter $H_{lp}(f)$, comb filter $\Psi_s(f)$, and the resulting band pass filter H(f) for s=72 and $w_i$={3–30 80–128 142–107 53–13}.
Figure 2B:
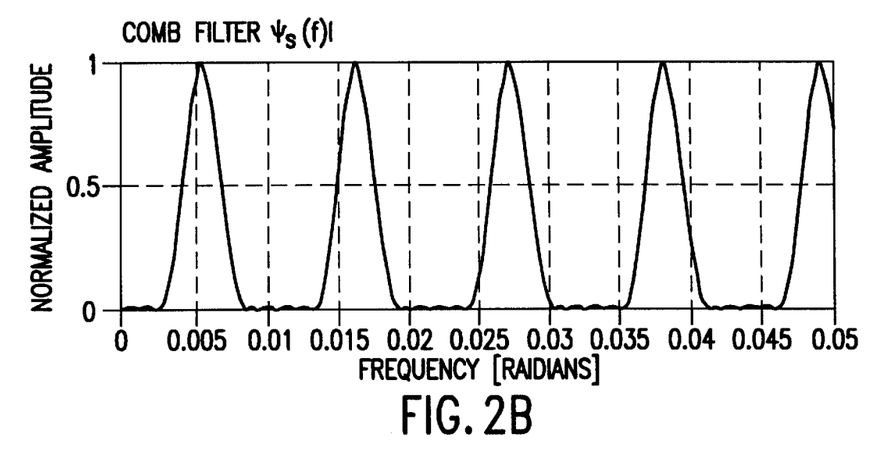
Figure 2C:
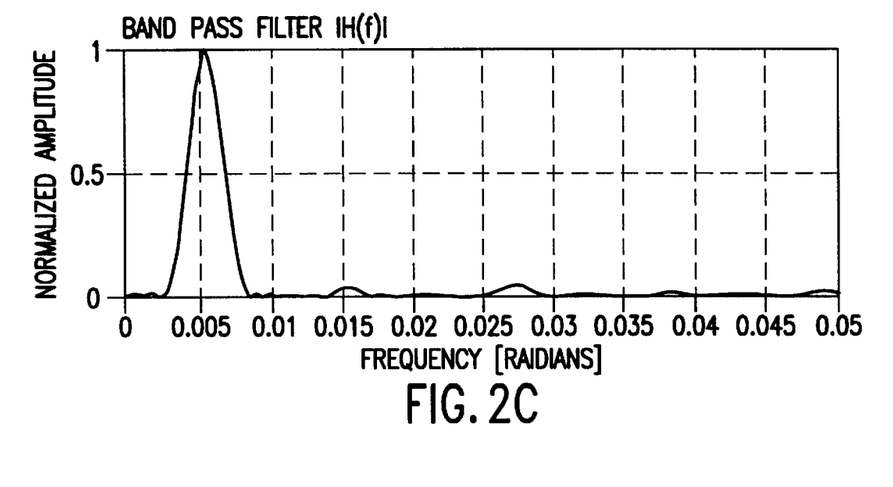

The low pass filter $H_{lp}(f)$ tends to select the first main lobe of $\Psi_s(f)$, resulting in band pass filter H(f). Side lobes occur at odd multiples of $f_r$. The side lobe with the maximum amplitude is at a frequency $\approx 15f_r$, and the attenuation is about 24 dB. An example is shown in FIG. 2 for s=72 and $w_i=\{3-30\ 80-128\ 142-107\ 53-13\}$. Filters $H_{lp}(f)$ and $\Psi_s(f)$ are connected via parameter s, which defines the position of the zeros of $H_{lp}(f)$ as well as the resonance frequencies in $\Psi_s(f)$. Thus, for a given set of weights $w_i$, the following characteristic parameters of filter function H(f) are almost independent of s:

relative position of zeros referred to the main lobe resonance frequency relative position of center frequencies of side lobes with respect to the resonance frequency quality factor of the main lobe, and side lobe attenuation referred to the amplification at resonance frequency. However, the absolute amplification is proportional to s, since the energy of $h_{lp}(n)$ is proportional to s. In order to achieve equal amplification at the resonance frequencies for different parameters s, it is necessary to multiply coefficients $w_i$ with a scaling factor proportional to 1/s.

Envelope detection in a preferred embodiment is achieved by implementing a second filter with an impulse response $\underline{h}(n)$ which is approximately orthogonal to h(n):

$\underline{h}(n)=h_{lp}(n)*\underline{\psi}_s(n)$ (Eq. 12)

with $$\underline{\psi}_S(n) = \sum_{i=0}^{7} \underline{w}_i \delta(n - i8s - 4s)$$ (Eq. 13)

Figure 3:
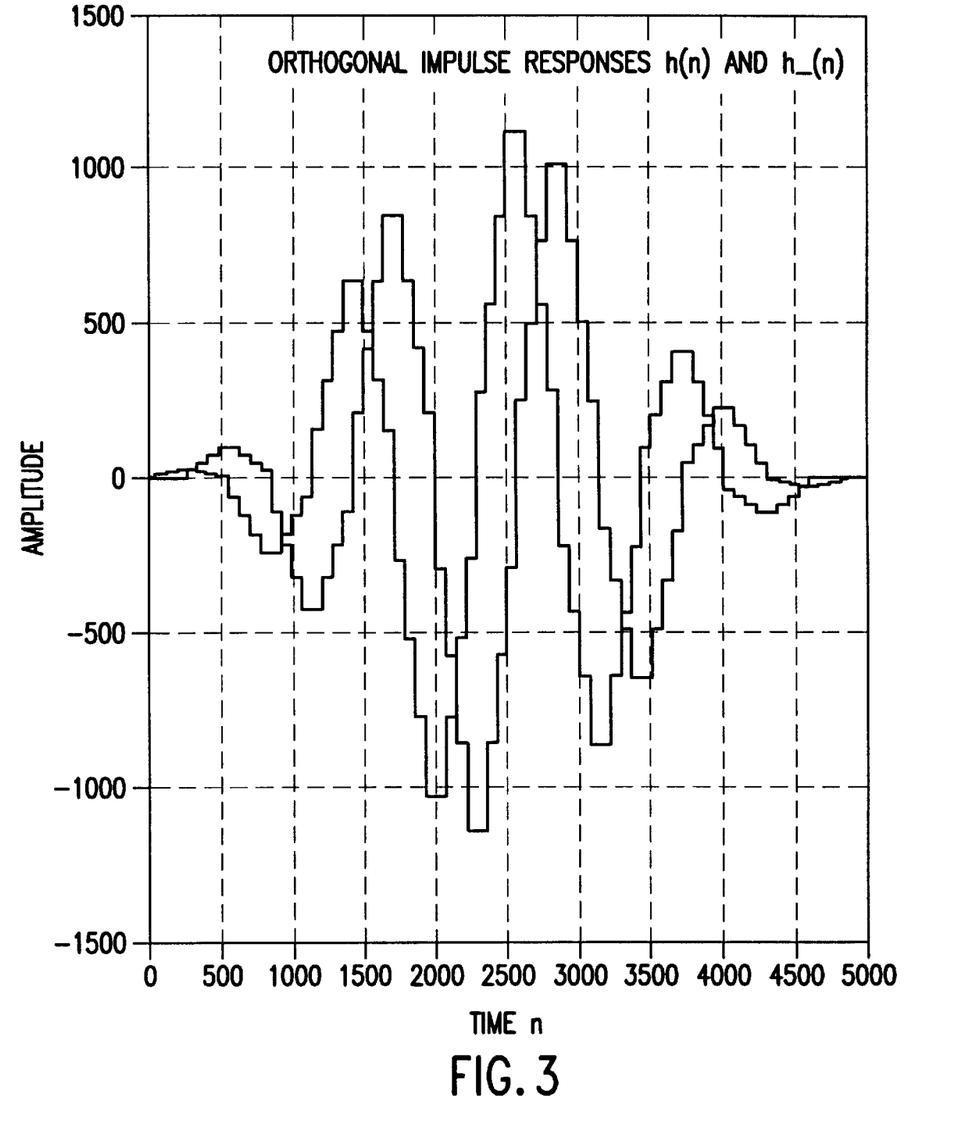
FIG. 3 depicts the approximately orthogonal impulse responses h(n) and h̲(n) for s=72, $w_i$={3–30 80–128 142–107 53–13} and $\underline{w}_i$={13–53 107–142 128–80 30–3}.

The unit impulse responses in $\underline{\psi}_s(n)$ are shifted by 4s compared to the unit responses in $\psi_s(n)$, and a different set of weights $\underline{w}_i$ is used. FIG. 3 illustrates the impulse responses h(n) and $\underline{h}(n)$ for an embodiment where s=72 and weights $w_i=\{3-30\ 80-128\ 142-107\ 53-13\}$ and $\underline{w}_i=\{13-53\ 107-142\ 128-80\ 30-3\}$. Here, coefficients $\underline{w}_i$ are equal to the set $w_i$, but with reversed order and different sign. In this case, $\underline{h}(n)$ can be obtained from h(n) by mirroring h(n) in time, inverting the sign, and introducing a time shift. Thus the amplitude characteristics $|H(f)|$ and $|\underline{H}(f)|$ are identical.

Filtering the $\Sigma$-$\Delta$ sequence x(n) with the FIR-filters h(n) and $\underline{h}(n)$ results in $y(n)=x(n)*h(n)$ $\underline{y}(n)=x(n)*\underline{h}(n)$ (Eq. 14)

The envelope signal e(n) is defined by $$e(n) = \sqrt{y^2(n) + \underline{y}^2(n)}.$$ (Eq. 15)

The resonance frequency $f_r$ of filters $|H(f)|$ and $|\underline{H}(f)|$ is approximately defined by the distance 16s between the zero crossings, i.e., $$f_r \approx \frac{f_0}{16s}.$$ (Eq. 16)

This definition results in a relatively fine resolution of the positions of possible resonance frequencies. For example, with $f_0=1$ MHZ, $f_{r1}=1.008$ kHz for $s_1$, =63, and $f_{r2}=0.992$ kHz for $S_2=62$, resulting in a relative difference $(f_{r1}-f_{r2})/f_{r1}=1.6\%$. However, the resolution is decreasing for higher resonances frequencies.

Approximation of the square root of the sum of squares. In the present application, the estimation of the square root of the sum of two squared numbers, i.e., $\sqrt{a^2+b^2}$, required for the calculation of e(n) to estimate the envelope, is achieved with the following three-step approach. Let a and b be two positive numbers. Then, (1) determine the maximum max(a,b) and the minimum min(a,b), (2) calculate $\sqrt{3}/2$ max(a,b)+½min(a,b), and (3) determine the maximum max(max(a,b), $\sqrt{3}/2$ max(a, b)+½min(a,b)).

The result of step (3) represents the approximation to $\sqrt{a^2+b^2}$. If numbers a and b define two complex vectors a+jb and b+ja, then in step (1), out of these two vectors the one with an argument between 0 and 45 degrees is selected. This vector is rotated clockwise by 30 degrees. Step (2) calculates the real part of this vector. In step (3), the real parts of the rotated and unrotated vectors are compared, and the maximum is the desired approximation.

For example, with a=45 and b=57:

(1) max(a,b)=57 and min(a,b)=45, (2) $\sqrt{3}/2$ max(a,b)+½min(a,b)=71.86, and (3) max(max(a,b), $\sqrt{3}/2$ max(a,b)+½min(a,b))=71.86.

Here, the approximation 71.86 is about 1% smaller than the exact result $$\sqrt{45^2 + 57^2} = 72.62.$$

It can be shown that the deviation of the approximation to the correct value lies between 0% and −3.4%. The worst case occurs with a=b. Then, the approximation yields a*cos($\pi$/12)=a*0.9659. The implementation of this method in the ALU requires only two comparisons of numbers (steps (1) and (3)) and one multiply and accumulate (MAC) instruction (step (2)) including one non-trivial multiplication (factor $\sqrt{3}/2$). It does not require a look-up-table, which is usually used to estimate the square root.

The signal processing so far has been derived with signals sampled at the sampling frequency $f_0$. However, calculation of signal e(n) at a rate $f_0$ is not necessary, since the sampling rate $f_{env}$ necessary for the digital representation of the envelope of a band pass signal is much lower. The lower limit for $f_{env}$ theoretically is given by $$f_{env,min} = 2B, \quad (\text{Eq. 17})$$

where B is the bandwidth of the band pass filter. In fact, the rate $f_{env,min}$ is even considerably lower than the Nyquist rate (given by maximum signal frequency of the band pass signal times two). Thus, the method used by preferred embodiments of the invention define orthogonal impulse responses h(n) and h(n) that allow an efficient implementation of downsampling stages and that is applicable for the integration in a digital low power ASIC (Application Specific Integrated Circuit).

Figure 4:
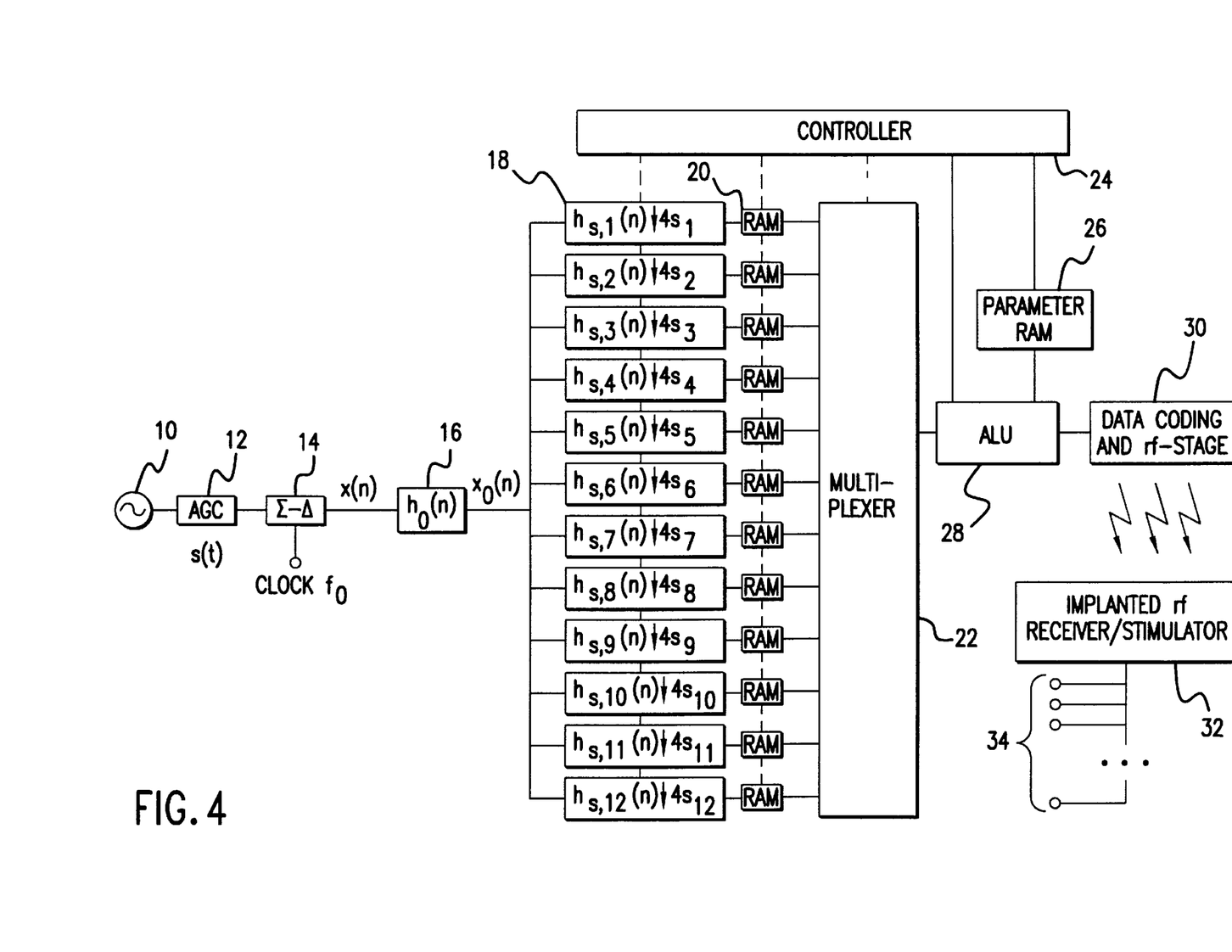
FIG. 4 depicts a block diagram of the implementation of a 12-channel filter bank.

An example of an embodiment of a 12-channel filter bank in the context of a cochlear implant system is illustrated in FIG. 4. A microphone 10 worn behind the ear of a user transforms the acoustic signals in the user's environment into analog electrical signals. A preprocessor 12 performs additional preprocessing of the signal such as pre-emphasis or automatic gain control. The input audio signal is analog to digital converted by a Σ-Δ modulator 14 which uses the oversampling technique to produce a relatively high frequency digital sequence x(n) which is representative of the input audio signal at sampling frequency $f_0$. The Σ-Δ sequence x(n) is then input to an input filter 16 where it is convolved with the input filter impulse response $h_0(n)$. Due to the simplicity of impulse response $h_0(n)$, this convolution requires only a few logic gates which convert the two level Σ-Δ sequence x(n) ∈ [−1, +1] into a five-level sequence $x_0(n)$ ∈ [0, ±1, ±2]. The rate of $x_0(n)$ is equal to the Σ-Δ sampling frequency $f_0$.

Peripheral filters 18 of each of the 12 filter bank channels perform the convolution of the five-level sequence $x_0(n)$ from the prefilter 16 with the impulse response $h_{s,k}(n)$ of each peripheral filter 18 (see Equations 4–7 and accompanying text) and downsample the result by a factor $4s_k$, where k represents each of the filter channels, k=1, 2, ... 12. Convolving $x_0(n)$ with $h_{s,k}(n)$ means to multiply and accumulate $x_0(n)$ and $h_{s,k}(n)$. Because of $h_{s,k}(n)$ ∈ [0, 1, 2] and $x_0(n)$ ∈ [0, ±1, ±2], the possible multiplication results are 0, ±1, +2, and ±4. These are powers of two and thus the convolution product at a particular time instance can be calculated with the help of a binary counter with variable increments 0, ±1, ±2, and ±4. Since the length of $h_{s,k}(n)$ is $8s_k$, the calculation of the downsampled convolution product, at a rate of (¼$s_k$)$f_0$, requires two counters with variable increments, where the starting times of the two counters are offset by $4s_k$. Sampling rate (¼$s_k$)$f_0$ is four times higher than the resonance frequency of each filter as estimated in Eq. 16, and thus usually considerably higher than the minimum frequency $f_{env,min}$ as defined in Eq. 17.

The convolution products at the peripheral filter counter outputs are then stored in turns in a 16-word peripheral convolution RAM 20 (also called a low pass RAM) where the sequence of RAM addresses is . . . 0, 1, 2, . . . 14, 15, 0, 1, . . . (ring configuration). For each filter channel, the combination of peripheral filter 18 with peripheral convolution RAM 20 requires only parameter $s_k$ for correct operation, which is set during an initialization procedure by a controller unit 24. After initialization, the filter and WRITE operations of peripheral filters 18 and peripheral convolution RAMs 20 work completely autonomously, without being influenced by controller unit 24 or any other signal processing stage.

The controller unit 24 in combination with a central convolution parameter RAM 26 (also called a comb filter weight RAM) also provides the instructions for an Arithmetic Logic Unit (ALU) 28 to perform the central convolutions with the comb filter weights and estimations of each bandpass envelope. If the controller unit 24 initiates the estimation of an envelope sample, the output of the peripheral convolution RAM 20 of the selected filter channel is connected to the ALU 28 via a multiplexer 22, and the actual contents of that peripheral convolution RAM 20 are read into the ALU 28. The 16 words from the RAM are organized as two sets of eight words, which are multiplied and accumulated with the corresponding sets of eight comb filter weights $w_{i,k}$ and $\underline{w}_{i,k}$ (i=0, 1, ... 7) which are read out from the central convolution parameter RAM 26 where they are stored during an initialization procedure. The resulting outputs are the orthogonal filter output signals $y_k(n\downarrow)$ and $\underline{y}_k(n\downarrow)$ (cf. Eqs. 14), where the argument n↓ denotes downsampling. The estimation of these signals $y_k(n\downarrow)$ and $\underline{y}_k(n\downarrow)$ requires 16 multiply and accumulate (MAC) instructions within the ALU 28. Together with the estimation of $e_k(n\downarrow)$ from $y_k(n\downarrow)$ and $\underline{y}_k(n\downarrow)$ (cf. Eq. 15), in all, 17 ALU instructions are necessary.

Thus, the ALU 28 produces a sequence of instantaneous bandpass envelopes for each filter channel. In the context of a cochlear implant system, the ALU 28 of a preferred embodiment would also adjust the envelope amplitude by a loudness mapping function specific to the individual user's hearing abilities. The loudness mapping may be an instantaneous logarithmic compression of the envelope and adjustment of the envelope amplitude above a threshold discerning level to a comfortable hearing level. The data coding and rf-stage 30 converts the sequence of instantaneous bandpass envelopes for each filter channel into a digital data stream which is radio transmitted. The implanted rf receiver/stimulator 32 worn by the user converts the received radio signal into narrow amplitude modulated biphasic stimulation pulses arranged sequentially by frequency band. Each frequency band has an associated electrode within the implanted portion of the device such that the electrode for a given frequency band will stimulate the neural fibers for that band of frequencies with the cochlea of the ear. As a result, the pulsatile stimulation of the cochlear neural fibers by the electrodes 34 induce stochastically distributed action potentials in the neural fibers which resemble the physiological response patterns of the stochastic activations of neural fibers in a healthy ear.

The envelope signals $e_k(n\downarrow)$ in FIG. 4 are calculated sequentially, controlled by a micro program. For example, a filter bank composed of 12 filter channels with equal bandwidths B=1 kHz, the minimum rate for calculating the envelope signals is given by $12*f_{env,min}=12*2*1$ kHz=24 kHz. Assuming that one clock cycle is necessary to execute one ALU instruction, the minimum ALU-clock frequency $f_{ALU,min}$ is given by $F_{ALU,min}=17*12*2B=408$ kHz. This operating frequency is far below the frequency usually used in DSPs.

Regarding the power consumption of the structures in FIG. 4, it is useful to separate the convolutions of the input $\Sigma$-$\Delta$-input sequence $x(n)$ with $h(n)$ and $\underline{h}(n)$ into the two stages of peripheral convolution and central convolution. The peripheral convolution involves low pass filtering and downsampling in peripheral filter stages. These peripheral filters are operated at the comparatively high $\Sigma$-$\Delta$-rate $f_0$, but the impulse responses are extremely simple. In combination with downsampling, the implementation requires only two counters with variable increments. Thus, the power consumption can be kept extremely low, if asynchronous counters are used. If an asynchronous counter of arbitrary length is driven at clock frequency $f_0$, then on average only two flip flops toggle and hence contribute to the power consumption. For example, for a 12-channel filter bank, an overall number of $12 \times 2 \times 2=48$ flip flops in average are toggled at $f_0$. Assuming $f_0=1$ MHZ and a power consumption of 10 $\mu$W/MHZ per flip flop results in a power consumption of only 0.48 mW.

The central convolution performs the convolution of the downsampled low pass filter output with the comb filter weights $w_{i,k}$ and $\underline{w}_{i,k}$ ($i=0.1, \ldots 7$). This step requires more complex hardware, including an ALU which contains registers, a multiplier, etc., however, the clock frequency of the ALU can be kept very low. For example, in an ALU composed of 6000 logical gates, approximately 30% of the logical gates would be active at any given time. Assuming a power consumption of 3 $\mu$W/MHZ per gate, and a clock frequency of $f_{ALU}=408$ kHz results in a power consumption of 2.2 mW. Thus, in the presented example, the power consumption of peripheral plus central convolution is approximately 2.68 mW, which is less than 1% of the 300 mW power consumption typical in a commercial DSP implementation of the CIS strategy.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. A cochlear implant system comprising:
   an implantable portion for implantation into a person to provide auditory signals to the patient; and
   an external portion to provide the auditory signals to the implanable portion, the external portion including
   a digital finite-impulse-response (FIR) bandpass filter for processing an input signal, the filter including
   an oversampling-type analog to digital converter to convert the input signal into a digital sequence;
   a low-pass FIR filter to convolve the digital sequence to produce a low-pass vector;
   a digital comb filter defined by at least one set of comb filter weights representative of weighted and time-shifted unit impulses to convolve the low-pass vector with the comb filter weights; and
   an envelope detector to detect a bandpass envelope of the digital FIR bandpass filter.

2. A cochlear implant system as in claim 1, wherein the analog to digital converter uses sigma-delta modulation.

3. A cochlear implant system as in claim 1, wherein the digital sequence is a two-level binary sequence.

4. A cochlear implant system as in claim 1, wherein the low-pass FIR filter directly convolves the digital sequence by multiplying and accumulating the digital sequence with a low-pass FIR filter impulse response.

5. A cochlear implant system as in claim 1, wherein the low-pass FIR filter is further comprised of:
   an input filter to convolve the digital sequence to produce a multi-level sequence having a plurality of allowable values;
   a peripheral filter to convolve the multi-level sequence to produce the low-pass vector;
   an output stage including at least one output counter to downsample the low-pass vector at selected times; and
   a low-pass random access memory (RAM) to sequentially store the downsampled low-pass vector.

6. A cochlear implant system as in claim 5, wherein the multi-level sequence is a five level sequence.

7. A cochlear implant system as in claim 5 wherein the digital comb filter is further comprised of:
   a comb filter weight RAM to store the sets of comb filter weights; and
   an Arithmetic Logic Unit (ALU) to calculate a convolution product of the downsampled low-pass vector with the comb filter weights.

8. A cochlear implant system as in claim 7 wherein the comb filter weight RAM stores two orthogonal sets of comb filter weights and the ALU calculates convolution products of the downsampled low-pass vector with the two orthogonal sets of comb filter weights.

9. A cochlear implant system as in claim 8, wherein the ALU further comprises the envelope detector.

10. A cochlear implant system as in claim 9, wherein the ALU operates at a frequency less than two times a maximum bandpass frequency of the digital FIR bandpass filter.

11. A cochlear implant system as in claim 9, wherein the ALU estimates the bandpass envelope of the digital FIR bandpass filter by:
    calculating a square root of a sum of squares of the convolution products calculated by the ALU.

12. A cochlear implant system as in claim 11, wherein the ALU estimates the value of the square root of the sum of two squares by:
    determining the greater of the roots of the two squares and the lesser of the roots of the two squares;
    calculating a sum of one half the lesser of the roots of the two squares and one half a product of the greater of the roots of the two squares and the square root of three; and
    selecting whichever is larger between the greater of the roots of the two squares and the calculated sum.

13. A cochlear implant system as in claim 1, wherein the envelope detector detects a bandpass envelope of the digital FIR bandpass filter by calculating a square root of a sum of squares of the convolution products calculated by the digital comb filter.

14. A cochlear implant system as in claim 13, wherein the envelope detector estimates the value of the square root of the sum of two squares by:
    determining the greater of the roots of the two squares and the lesser of the roots of the two squares;
    calculating a sum of one half the lesser of the roots of the two squares and one half a product of the greater of the roots of the two squares and the square root of three; and selecting whichever is larger between the greater of the roots of the two squares and the calculated sum.

15. A cochlear implant system comprising:

an implantable portion for implantation into a person to provide auditory signals to the patient; and an external portion to provide the auditory signals to the implantable portion, the external portion including a digital filter bank for processing an input signal, comprised of a plurality of digital finite-impulse-response (FIR) bandpass filters arranged in parallel, the filter bank including an oversampling-type analog to digital converter to convert the input signal into a digital sequence;

a plurality of low-pass FIR filters arranged in parallel to convolve the digital sequence to produce a plurality of low-pass vectors;

a plurality of digital comb filters each associated with one of the plurality of low-pass FIR filters and each defined by at least one set of comb filter weights representative of weighted and time-shifted unit impulses wherein each of the plurality of digital comb filters convolves the low-pass vector from the associated low-pass FIR filter with the comb filter weight; and an envelope detector to sequentially detect a bandpass envelope of each of the plurality of digital FIR bandpass filters.

16. A cochlear implant system as in claim 15, wherein the analog to digital converter uses sigma-delta modulation.

17. A cochlear implant system as in claim 15, wherein the digital sequence is a two-level binary sequence.

18. A cochlear implant system as in claim 15, wherein each of the plurality of low-pass FIR filters directly convolves the digital sequence by multiplying and accumulating the digital sequence with a low-pass filter impulse response.

19. A cochlear implant system as in claim 15, wherein each of the plurality of FIR bandpass filters multiplies the weighted and time shifted unit impulses of the associated comb filter by a scaling factor inversely proportional to a center bandpass frequency of the FIR bandpass filter in order to equally amplify the bandpass frequencies of the FIR bandpass filter.

20. A cochlear implant system as in claim 15, wherein the plurality of low-pass FIR filters is further comprised of:

an input filter which convolves the digital sequence to produce a multi-level sequence having a plurality of allowable values;

a plurality of peripheral filters arranged in parallel which convolve the multi-level sequence to produce the plurality of low-pass vectors, and wherein each of the peripheral filters includes:

an output stage including at least one output counter which downsamples the low-pass vector at selected times, and a low-pass random access memory (RAM) which sequentially stores the downsampled low-pass vector.

21. A cochlear implant system as in claim 20, wherein the multi-level sequence is a five level sequence.

22. A coahlear implant system as in claim 20, wherein the plurality of digital comb filters is further comprised of:

a comb filter weight RAM for storing the sets of comb filter weights for each of the plurality of digital comb filters; and an Arithmetic Logic Unit (ALU) to sequentially calculate a convolution product of each of the plurality of downsampled low-pass vectors with the comb filter weights of the associated digital comb filter.

23. A cochlear implant sysem as in claim 22, wherein the comb filter weight RAM stores two orthogonal sets of comb filter weights for each of the plurality of digital comb filters and the ALU sequentially calculates convolution products of each of the plurality of downsampled low-pass vectors with the two orthogonal sets of comb filter weights of the associated digital comb filter.

24. A cochlear implant system as in claim 23, wherein the ALU further comprises the envelope detector.

25. A cochlear implant system as in claim 24, wherein the ALU operates at a frequency less than two times a maximum bandpass frequency of the digital filter bank.

26. A cochlear implant system as in claim 24, wherein the ALU estimates the bandpass envelope of each of the plurality of FIR bandpass filters by:

calculating a square root of a sum of squares of the convolution products of the downsampled low-pass vectors with the two orthogonal sets of comb filter weights of the associated digital comb filter.

27. A cochlear implant system as in claim 26, wherein the ALU estimates the value of the square root of the sum of two squares by:

determining the greater of the roots of the two squares and the lesser of the roots of the two squares;

calculating a sum of one half the lesser of the roots of the two squares and one half a product of the greater of the roots of the two squares and the square root of three; and selecting whichever is larger between the greater of the roots of the two squares and the calculated sum.

28. A cochlear implant system as in claim 15, wherein the envelope detector sequentially detects a bandpass envelope of each of the plurality of FIR bandpass filters by calculating for each of the plurality of digital comb filters a square root of a sum of squares of the convolution products calculated by the digital comb filter.

29. A cochlear implant system as in claim 28, wherein the envelope detector estimates the value of the square root of the sum of two squares by:

determining the greater of the roots of the two squares and the lesser of the roots of the two squares;

calculating a sum of one half the lesser of the roots of the two squares and one half a product of the greater of the roots of the two squares and the square root of three; and selecting whichever is larger between the greater of the roots of the two squares and the calculated sum.

* * * * *

UNITED STATES PATENT AND TRADEMARK OFFICE
CERTIFICATE OF CORRECTION

PATENT NO. : 5,983,139
DATED : November 9, 1999
INVENTOR(S) : Zierhofer

It is certified that error appears in the above-identified patent and that said Letters Patent is hereby corrected as shown below:

Column 9, Line 53, change "implanable" to --implantable--

Signed and Sealed this

Twelfth Day of September, 2000

Attest:

Q. TODD DICKINSON

*Attesting Officer*   *Director of Patents and Trademarks*